Dec. 8, 1970 TAMAKI OHASHI 3,545,288

PUSHBUTTON TYPE TUNING APPARATUS

Filed Oct. 7, 1968

United States Patent Office 3,545,288
Patented Dec. 8, 1970

3,545,288

PUSHBUTTON TYPE TUNING APPARATUS

Tamaki Ohashi, 1629 Tanashi-shi, Tokyo, Japan

Filed Oct. 7, 1968, Ser. No. 765,434
Claims priority, application Japan, Oct. 7, 1967, 42/64,363
Int. Cl. F16h *35/18*
U.S. Cl. 74—10.33 9 Claims

ABSTRACT OF THE DISCLOSURE

A pushbutton type tuning aparatus in which a connecting member is engaged with a projection on an actuating member which is slidable in a first arm to operate a locking member for a movable setting plate on the first arm, a second arm with a pushbutton being engaged with the connecting member through oblique surfaces so that when the pushbutton is pushed horizontally, an oblique force with a vertical component is applied to the actuating member and first arm through the intermediary of the connecting member.

BRIEF SUMMARY OF THE INVENTION

This invention relates to a pushbutton type tuning apparatus for a radio or the like, and more particularly to an apparatus for preventing any error in tuning in such a tuning apparatus.

I have previously developed a tuning apparatus in which there are a first arm having a setting plate for setting a tuning point, a locking member for locking said plate by a lever action, a slidable actuating member for operating said locking member, and a second arm which is independent of said first arm and has a pushbutton, these two arms being connected together by a pin provided on the actuating member and inserted in an oblique opening in the second arm. The advantage effected by this construction is such, that even when the second arm is advanced while being inclined upwards or downwards, depending on the changes in the direction of the pushbutton pushing force, owing to a gap formed between the second arm and a machine frame, the pin is always acted on by a component of a force in either upward or downward direction due to the oblique opening, so that the first arm may be always forcibly pushed in the same direction, whereby the objection that the first arm is unreliably moved upwards or downwards because of the play formed between the first arm and the machine frame can be prevented and the engaging angle between the setting plate and a crank moving with a tuning variable element can be accurately regulated for preventing any tuning frequency error.

In this construction, it is required for the pin to be more or less slidable in relation to the oblique opening in order to forcibly push the first arm, but the pin does not slide smoothly if the oblique surface of the oblique opening is rough and it often happens that the pushing force for the first arm becomes insufficient or unreliable.

This invention seeks to remove this defect and make it more reliable and easier to forcibly push the first arm and simplify the manufacture of a tuning apparatus. In accordance with the invention, the engagement between the arms is achieved through a connecting member engaged with the first arm and in contact with the second arm through inclined surfaces such that a horizontal force applied to the second arm produces a vertical force on the connecting member and thereby on the first arm.

DETAILED DESCRIPTION

Figure 1:
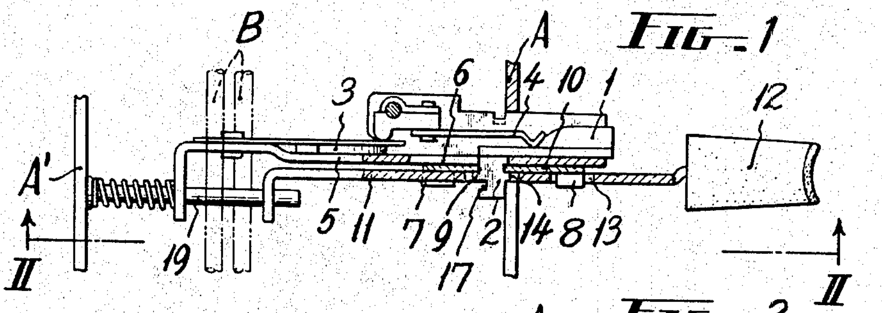
FIG. 1 is a top plan view, partly in section, of an embodiment of the apparatus according to this invention.

An actuating member 1 is provided with a horizontal T-shaped piece 2 projecting therefrom, the piece 2 being engaged in a longitudinal slot 6 in a first arm 5 having a pivotable setting plate 3 and a locking member 4. A separate connecting member 10 is provided at its ends with respective end pieces 7 and 8, piece 7 being inclined whereas piece 8 is horizontal. The member 10 is provided at its middle portion with an opening 9. The connecting member 10 is engaged with the first arm 5 by inserting the narrow part of the T-shaped piece 2 in opening 9. A second separate arm 11 is provided at one end with a pushbutton 12 and with openings 13 and 14. The arm 11 has a profiled groove 15 formed in its lower edge. The piece 8 is received in opening 13 while the wide portion of the T-shaped piece 2 is inserted in opening 14 and the inclined piece 7 is engaged with groove 15. The thus assembled arrangement constitutes a tuning member assembly.

Each of the pieces 2, 7 and 8 can be formed integrally with its respective support by cutting the support and bending the piece therefrom. A spring 16 has one end engaged in a groove 17 in the T-shaped piece 2 and its other end secured to a claw 18 of the second arm 11.

Figure 2:
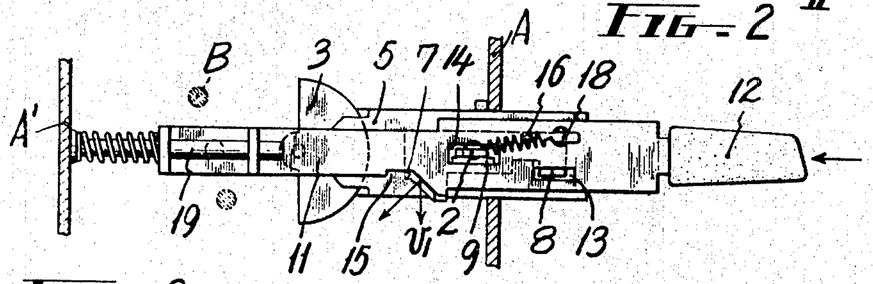
FIG. 2 is a sectional view taken along the line II—II in FIG. 1.
Figure 3:
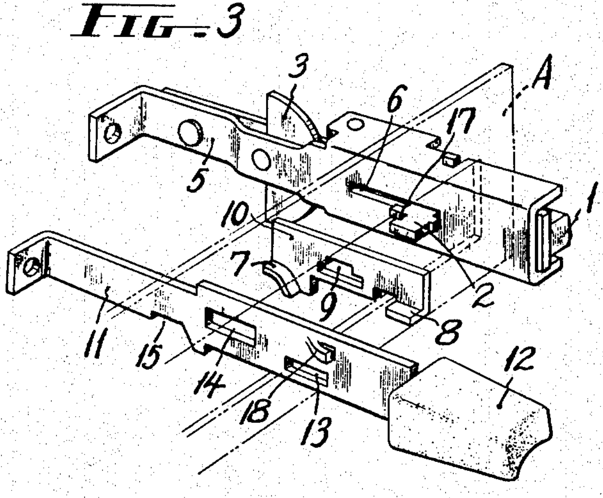
FIG. 3 is an exploded perspective view of the essential portion of the apparatus of FIG. 1.

If the pushbutton 12 is pushed in the direction of the arrow in FIG. 2, the entire tuning member assembly is advanced while being guided by a machine frame front plate A and a supporting rod 19 projecting from a machine frame rear plate A′, and its advance is limited by contact of the setting plate 3 with a crank B rotatably mounted on the machine frame. If, the pushing force on the pushbutton 12 is increased, the second arm 11 is advanced in relation to the first arm 5 along with the connecting member 10 and the actuating member 1, and the actuating member 1 becomes wedged between the rear end of the locking member 4 and the first arm 5 for operating the locking member 4 to lock the setting plate 3 in the position dictated by the crank B. In this case, the piece 7 and the groove 15 are oblique in relation to the advancing direction of the tuning member assembly, so that a force is applied to the piece 7 which has a component $V_1$ (FIG. 2) acting downwards. Accordingly, the connecting member 10 is subjected to a force tending to turn the member 10 in a counterclockwise direction about the engaging portion of the piece 8 in the opening 13, so that by the engagement between the groove 9 and the piece 2 the first arm 5 is pushed forcibly downwards. Accordingly, if there is an error in manufacture at the engaging portion between the first arm 5 and the machine frame front plate resulting in a gap permitting the first arm 5 to move in upward and downward directions, and even if the second arm 10 is advanced while being inclined upwards or downwards (depending on the direction of the pushbutton pushing force) the first arm 5 is always pushed forcibly in either the upper or lower direction (the upper direction will be explained hereinafter with reference to FIG. 4), so that any gap formed between the first arm 5 and the machine frame becomes negligible and the engaging angle between the crank and the setting plate can be precisely reproduced, and any occurrence of tuning frequency selection error can be fully prevented. This action is equally accomplished when, after the condition where the tuning member assembly has been returned to the original position after the release of the pushing force, the pushbutton is again pushed so that the setting plate 3 reproduces its locked engaging angle on the crank B.

Figure 4:
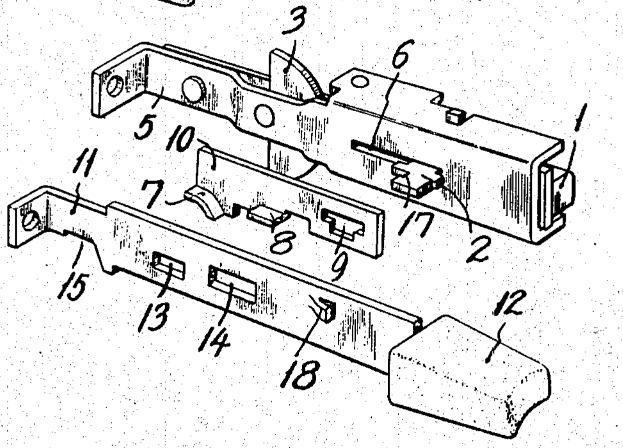
FIG. 4 is an exploded perspective view of a modified embodiment of the apparatus.

In the embodiment shown in FIG. 4, the piece 8 and the groove 9 are interchanged in their front and rear position, and at the same time the openings 13 and 14 are also interchanged in their front and rear positions, so that the connecting member 10 may serve as a lever having its fulcrum at its middle position. In this case, the first arm 5 is pushed forcibly upwards by the connecting member 10, and the same object can be accomplished.

In the invention, as described above, the engaging angle between the crank and the setting plate can be accurately regulated, and, according to the invention, by utilizing a force exerting on the oblique piece of the connecting member and the oblique surface of the groove of the second arm, a lever action is given to the connecting member and by this lever action the first arm is subjected to a pushing force, so that by the distance ratio between the piece 7 and the groove 9 and the piece 8, that is, the lever ratio in relation to the piece of the actuating member, the first arm may be subjected to a stable and accurate multiplied pushing force, and the wearing degree between the oblique piece and the groove can be decreased. Though the piece 2 on the actuating member is subjected to a force with horizontal and vertical components, the piece 2 may have a mechanical strength to resist said force and not be deformed or broken even for prolonged use, because the piece is designed to be flat in shape and arranged horizontally.

Additionally, the apparatus can be assembled simply in that the first arm, the connecting member and the second arm are placed upon one another in order, so that the assembly is very simple in manufacturing operation and is suitable for mass production.

What is claimed is:

1. A pushbutton type tuning apparatus comprising a first arm including a movable setting plate, a locking member for locking said setting plate, a slidable actuating member for operating said locking member, a second arm including a pushbutton, and a connecting member operatively engaged with said first and second arms, said connecting member and second arm having inclined engaging surfaces such that when the second arm is pushed horizontally, the connecting member is acted on by an inclined force having a vertical component to cause the first arm to be forcibly pushed vertically by said connecting member, said connecting member having an opening and said first arm including a piece projecting therefrom and engaged in said opening so that the inclined force on the connecting member acts on the first arm through such piece.

2. An apparatus as claimed in claim 1, wherein the connecting member includes an oblique piece and the second arm has an oblique groove against which said oblique piece is engaged, said oblique piece and groove forming said inclined engaging surfaces.

3. An apparatus as claimed in claim 1, wherein said piece projecting from said first arm is secured to said actuating member, said first arm having a slot through which said piece on the actuating member projects.

4. An apparatus as claimed in claim 3, wherein said connecting member includes a projecting piece spaced from said inclined surface thereof, and said second arm has an opening receiving said projecting piece on said connecting member whereby the latter piece forms a fulcrum about which the connecting member is pivotably urged by said vertical component of the inclined force.

5. An apparatus as claimed in claim 4, wherein said opening in the connecting member is between said oblique piece and said projecting piece thereon.

6. An apparatus as claimed in claim 4, wherein said projecting piece on the connecting member is between said oblique piece thereon and said opening therein.

7. An apparatus as claimed in claim 4, wherein said second arm has an opening in which said piece projecting from said first arm is engaged.

8. An apparatus as claimed in claim 4 comprising a spring connected to said second arm and said piece secured to said actuating member.

9. An apparatus as claimed in claim 8, wherein said slot in said first arm is elongated and said piece on the actuating member is slidable in said slot against the action of said spring.

References Cited

UNITED STATES PATENTS

| | | | |
|---|---|---|---|
| 2,928,283 | 3/1960 | Teaf | 74—10.33 |
| 3,403,564 | 10/1968 | Ohashi | 74—10.33 |

MILTON KAUFMAN, Primary Examiner

U.S. Cl. X.R.

334—7